(12) United States Patent
Huang et al.

(10) Patent No.: US 7,877,872 B2
(45) Date of Patent: Feb. 1, 2011

(54) METHOD FOR MANUFACTURING PRINTED CIRCUIT BOARD

(75) Inventors: Hsiao-Chun Huang, Taoyuan (TW);
Meng-Hung Wu, Taoyuan (TW);
Cheng-Hsien Lin, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 543 days.

(21) Appl. No.: 11/967,004

(22) Filed: Dec. 29, 2007

(65) Prior Publication Data

US 2009/0031561 A1 Feb. 5, 2009

(30) Foreign Application Priority Data

Aug. 3, 2007 (CN) .................... 2007 1 0075609

(51) Int. Cl.
*H01K 3/10* (2006.01)
(52) U.S. Cl. .................... 29/852; 29/825; 29/831; 29/846; 438/118; 438/124; 438/125
(58) Field of Classification Search .................... 29/852, 29/825, 830, 831, 846, 847; 438/118, 124, 438/125
See application file for complete search history.

(56) References Cited

U.S. PATENT DOCUMENTS 7,282,394 B2 * 10/2007 Cho et al. .................... 438/118
7,790,354 B2 * 9/2010 Ishigaki et al. ........... 430/280.1

FOREIGN PATENT DOCUMENTS

| CN | 2850203 Y | 12/2006 |
| JP | 2005-331932 A | 12/2005 |

\* cited by examiner

*Primary Examiner*—Thiem Phan
(74) *Attorney, Agent, or Firm*—Jeffrey T. Knapp

(57) ABSTRACT

A method for manufacturing a hollowed printed circuit board includes steps of: providing an electrically conductive layer; laminating a first dielectric layer having a first through opening defined therein on a first surface of the electrically conductive layer; forming a protecting layer on the first surface of the electrically conductive layer in the first opening; creating an electrically conductive pattern in the conductive layer; removing the protecting layer; and laminating a second dielectric layer having a second through opening defined therein on an opposite second surface of the electrically conductive layer in a manner that the first through opening is aligned with the second through opening, thereby a portion of the electrically conductive layer is exposed to exterior through the first through opening and the second through opening.

10 Claims, 9 Drawing Sheets

METHOD FOR MANUFACTURING PRINTED CIRCUIT BOARD

BACKGROUND

1. Technical Field

The present invention relates to a method for manufacturing a flexible printed circuit board and, particularly, to a method for manufacturing a multilayer flexible printed circuit board having different thicknesses in different areas.

2. Discussion of Related Art

Hollowed printed circuit boards are printed circuit boards that are hollowed. Two sides of the hollowed area are exposed to exterior thus the hollowed printed circuit board can provide electrical connection on the two sides.

A method for manufacturing such a hollowed printed circuit board includes steps of: laminating a first dielectric layer having an opening preformed thereon on a first surface of a copper layer; forming conductive patterns in the copper layer; and laminating a second dielectric layer having an opening preformed thereon on a second surface of the copper layer, the two openings are aligned with each other thereby defining a hollowed area in the conductive layer.

Usually, a protective layer is used to protect the first surface of the copper layer when the conductive patterns are formed. However, there is a cliff-like structure between the first dielectric layer and the conductive layer, creating gaps between the protective layer and the conductive layer. Thus, etchant can infiltrate into the gap to damage the conductive layer.

Therefore, there is a desire to develop a method for manufacturing a hollowed printed circuit board that prevents damages in the conductive layer.

SUMMARY OF THEN INVENTION

This and other features and advantages of the present invention as well as the preferred embodiments thereof and a method for manufacturing a hollowed printed circuit board in accordance with the invention will become apparent from the following detailed description and the descriptions of the drawings.

In one embodiment, a method for manufacturing a hollowed printed circuit board includes steps of: providing an electrically conductive layer; laminating a first dielectric layer having a first through opening defined therein on a first surface of the electrically conductive layer; forming a protective layer on the first surface of the electrically conductive layer in the first opening; creating an electrically conductive pattern in the conductive layer; removing the protective layer; and laminating a second dielectric layer having a second through opening defined therein on an opposite second surface of the electrically conductive layer in a manner that the first through opening is aligned with the second through opening, thereby a portion of the electrically conductive layer is exposed to exterior through the first through opening and the second through opening.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
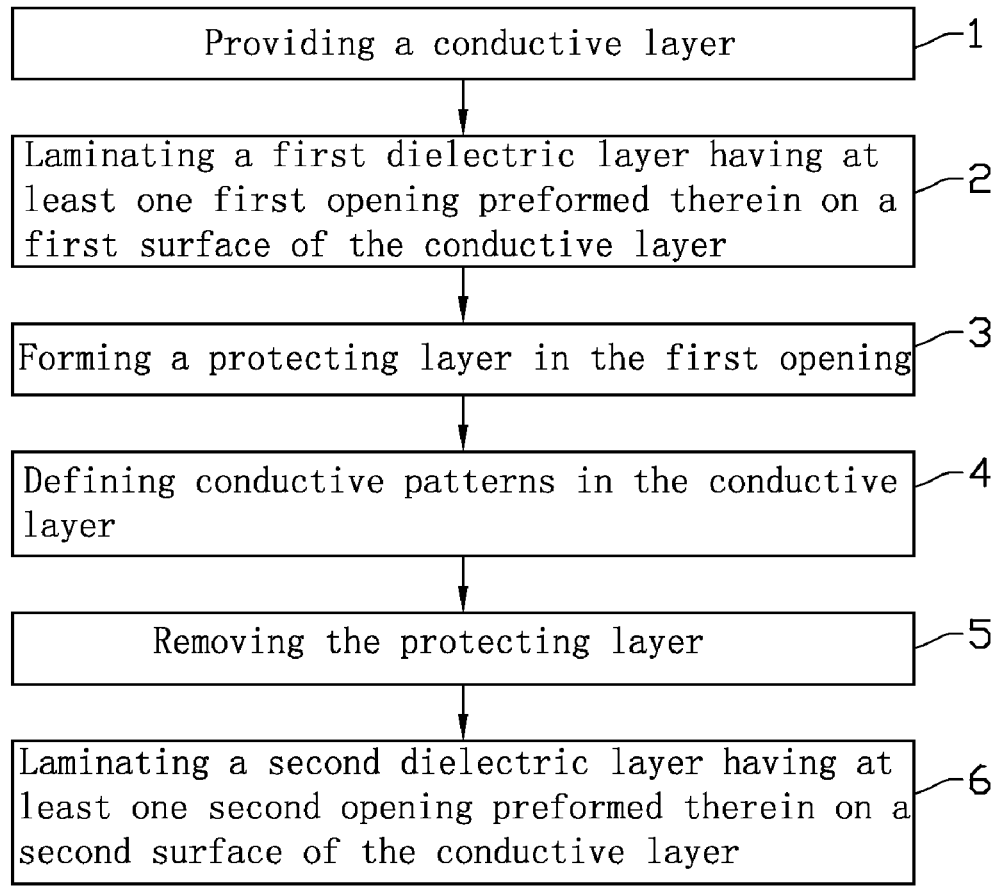
FIG. 1 is a flow char of a method for manufacturing a hollowed printed circuit board in accordance with a preferred embodiment.

FIG. 1 illustrates a method for manufacturing a hollowed printed circuit and the method will be described more detail in accordance with the following preferred embodiment.

Figure 2:
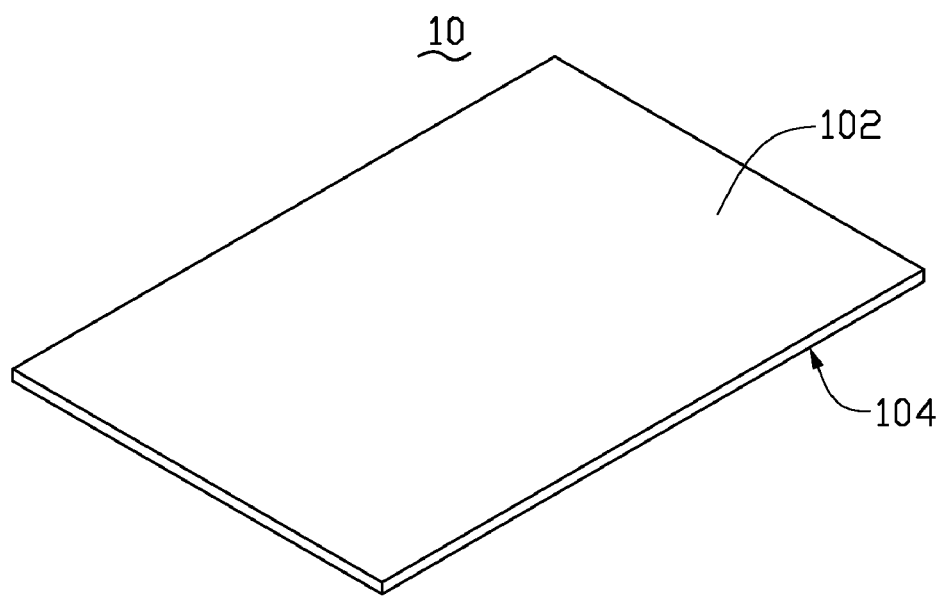
FIG. 2 is a schematic view showing a conductive layer used in a method for manufacturing a hollowed printed circuit board.

Referring to FIG. 2, a conductive layer 10 includes a first surface 102 and a second surface 104 opposite to the first surface 102. The conductive layer 10 can be made of a material having high electrical conductivity, such as copper, silver, etc. Advantageously, the conductive layer 10 can be processed using an acid solution such that a roughness of the first surface 102 and the second surface 104 is improved.

Figure 3:
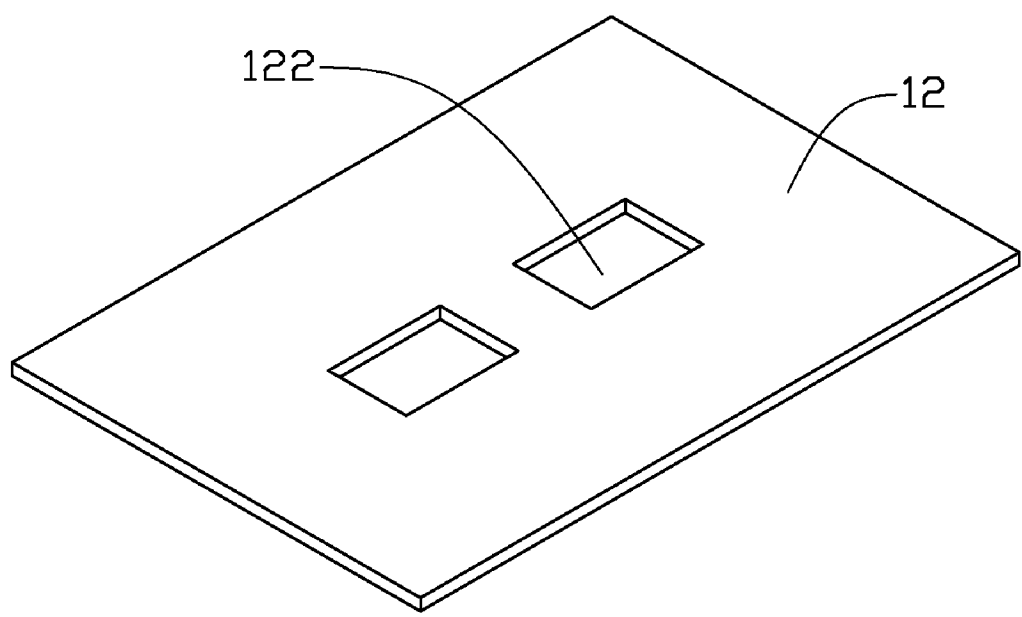
FIG. 3 is a schematic view showing a first dielectric layer used in a method for manufacturing a hollowed printed circuit board.

Referring to FIG. 3, a first dielectric layer 12 with two first openings 122 defined therein is shown. The first dielectric layer 12 can be made of a flexible material or a rigid material. Examples of the flexible material include polyimide, polyethylene terephtalate, polytetrafluoroethylene, polyamide, polymethylmethacrylate, polycarbonate, polyamide polyethylene-terephthalate copolymer and any combination thereof. Examples of the rigid material include glass fabrics and epoxy glass fabrics. The first openings 122 can be formed by stamping or laser ablation process. It is understood that one or more first openings can be formed according to practical need in another embodiment.

Figure 4:
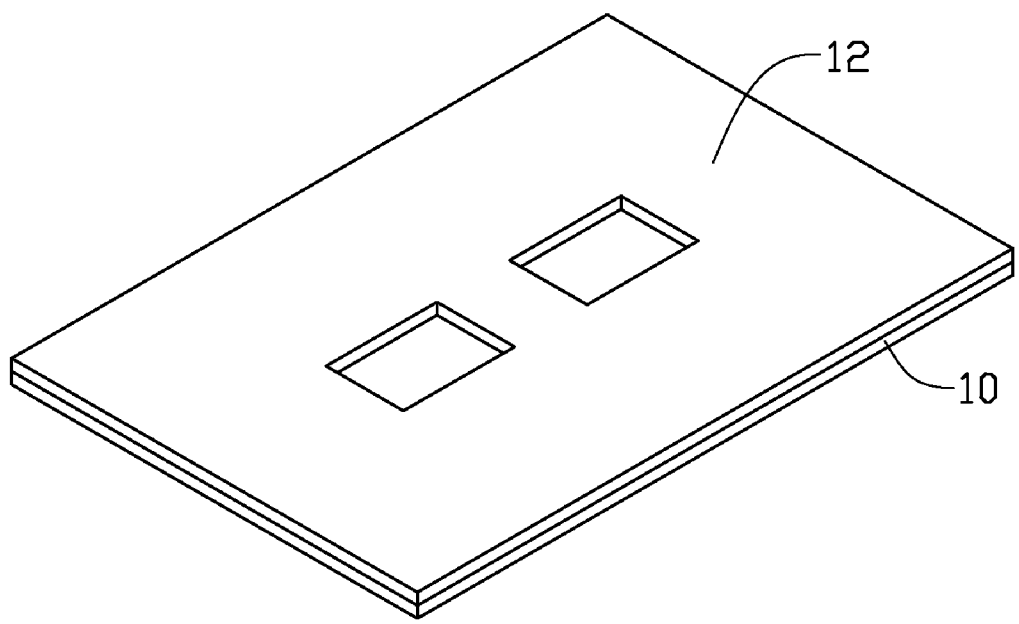
FIG. 4 is a schematic view showing the dielectric layer of the FIG. 3 is laminated on the conductive layer of FIG. 2.

Referring to FIG. 4, the first dielectric layer 12 is applied and laminated on the conductive layer 10. When the conductive layer 10 is processed by an acid solution, a roughness of the first surface 102 and the second surface 104 is improved, as a result, adhesion between the conductive layer 10 and the first dielectric layer 12 can also be improved. The conductive layer 10 can be etched using an acid solution, such as, hydrochloric acid to improve a surface roughness thereof.

Figure 5:
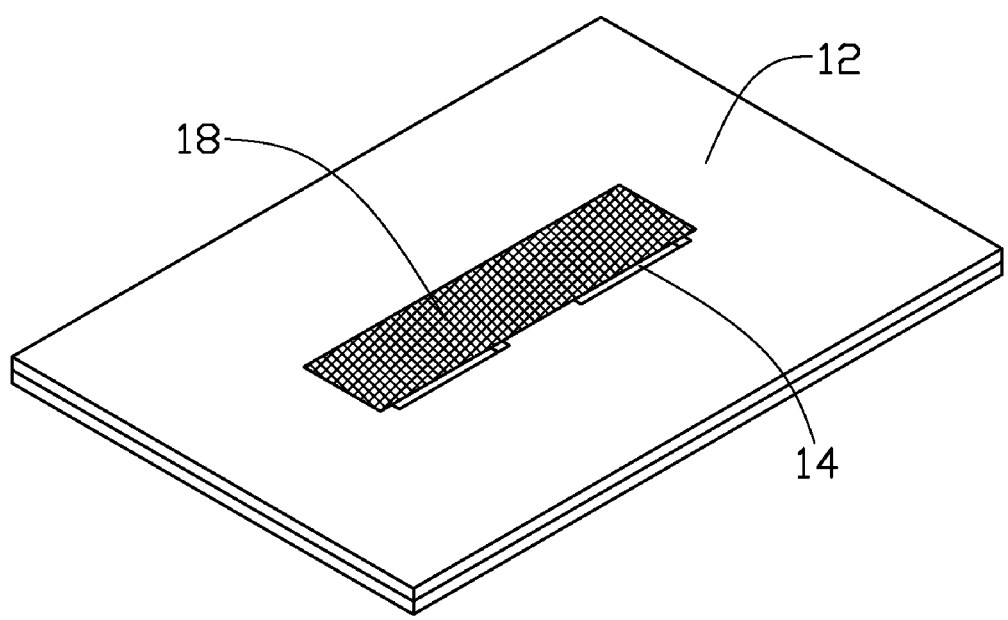
FIG. 5 is a schematic view showing that coating is formed in the opening of the dielectric layer of FIG. 4.

Referring to FIG. 5, a coating 14 is formed in the two first openings 122. The coating 14 includes a curable composition that can be resolved in a particular solvent. Examples of the coating 14 include solder resist and liquid photoresist. The two first openings 122 are fully filled by the coating 14.

In this embodiment, the coating 14 is formed in the two first openings 122 using a screen-printing method. A 250-mesh screen template 18 is disposed above the dielectric layer 12 about 1 mm. The screen template 18 has a thickness of 50 micrometers. An squeezer having a hardness of 80 degrees is provided and disposed on the screen template 18. A flooder angle of the squeezer is 20°. A pressure of 0.35 Mpa is applied on the squeezer. A velocity of the squeezer is 60 mm/s. Alternatively, the coating 14 can be formed using other method such as spraying, brush coating and dip coating.

Figure 6:
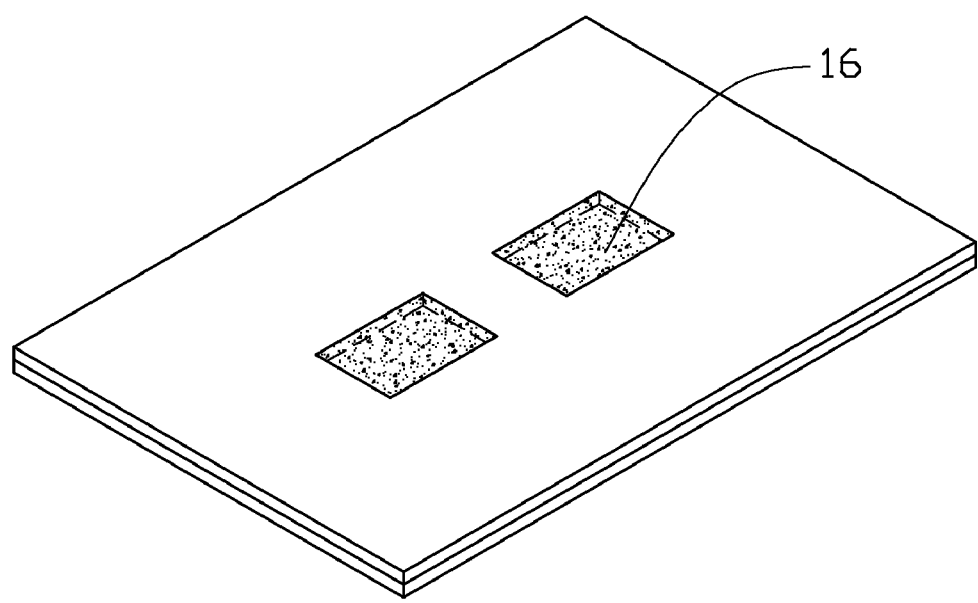
FIG. 6 is a schematic view showing that the coating of FIG. 4 is cured.

Referring FIG. 6, the coating 14 is cured and transformed into a protective layer 16. In this embodiment, the coating 14 is comprised of a solder resist and the coating 14 is cured in an infrared ray oven. A temperature of the infrared ray oven is in the range from 90° C. to 110° C. Preferably, the temperature of the infrared ray oven is 100° C. The coating 14 is heated for 5 minutes to 30 minutes.

If liquid photoresist is used to form the protective layer 16, the curing process varies on whether the liquid photoresist belong to a positive photoresist or a negative photoresist. Positive photoresist can be heated and cured. Negative photoresist must be exposed before being heated to cure.

Figure 7:
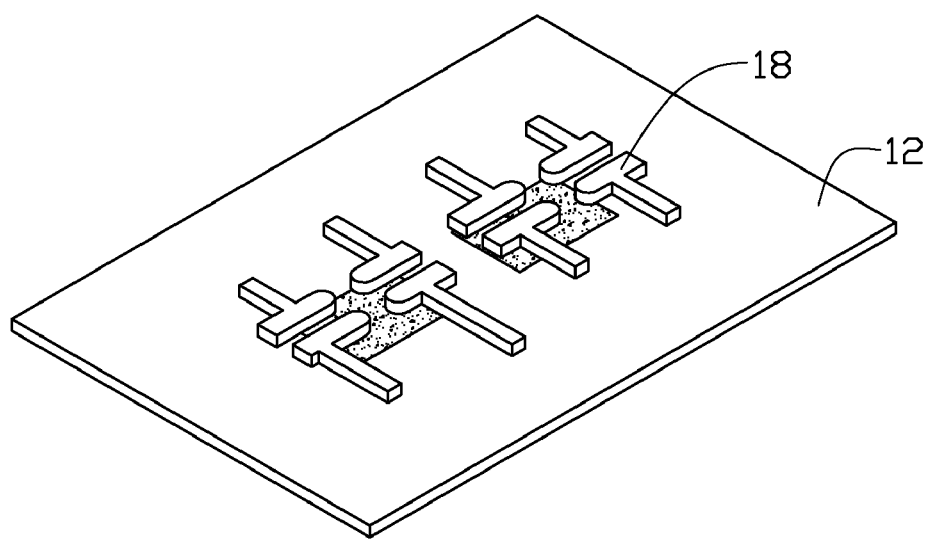
FIG. 7 is a schematic view showing that conductive patterns are formed in the conductive layer of FIG. 4.

Referring to FIG. 7, conductive patterns 18 are formed in the conductive layer 10 after the protective layer 16 is formed. Conductive patterns 18 can be formed using an etching process. Specifically, a dry film can be applied on the second surface 104 of the conductive layer 10, and then the dry film is exposed under a photo mask, the exposed dry film can be developed so as to form patterns in the dry film, finally, the conductive layer 10 is etched with an etchant.

Figure 8:
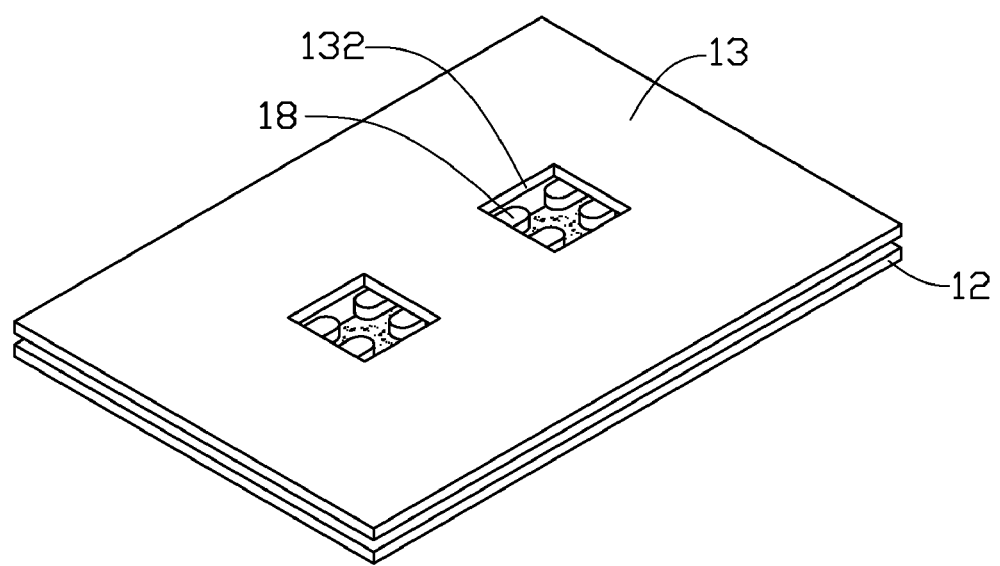
FIG. 8 is a schematic view showing another dielectric layer laminated on the conductive layer of FIG. 7.

Referring to FIG. 8, a second dielectric layer 13 is applied on the second surface 104 of the conductive layer 10. Two second openings 132 are preformed in the second dielectric layer 13. Positions of the two second openings 132 are predetermined such that each second opening 132 is aligned with a corresponding first opening 122. Each first opening 122 and the corresponding second opening 132 define a hollowed area on the conductive layer 10. The hollowed area is exposed to exterior through the first opening 122 and the corresponding second opening 132.

Figure 9:
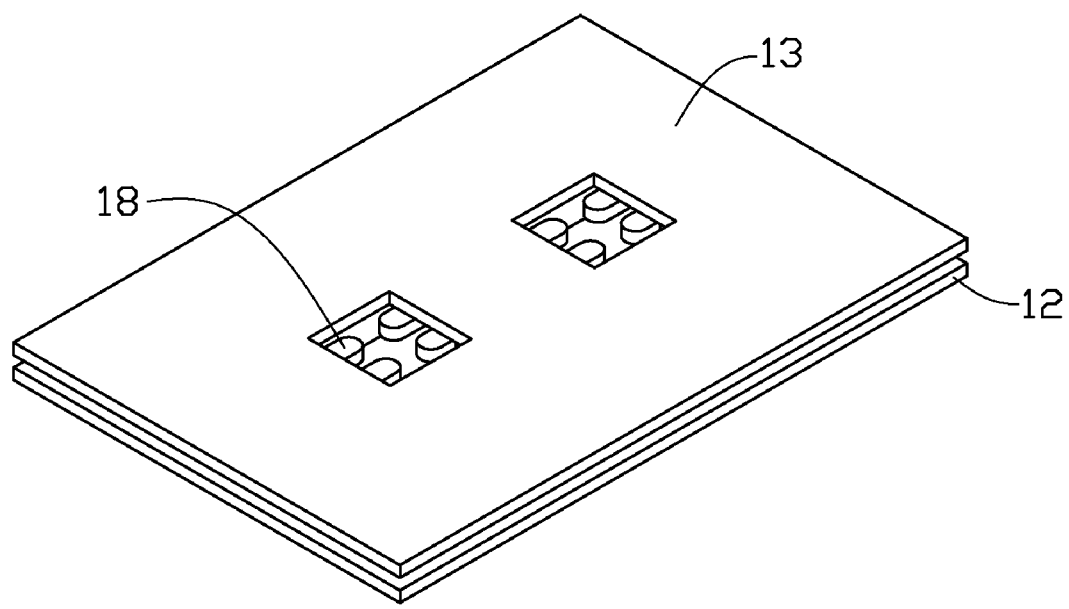
FIG 9 is similar to FIG. 8, but showing the protective layer removed.

Referring to FIG. 9, the protective layer 16 is removed after the conductive patterns 18 are formed. Alkali solution such as sodium hydroxide solution and sodium carbonate solution can be used to remove the protective layer 16.

In this method for manufacturing a hollowed printed circuit board, a protective layer 16 is formed prior to the formation of the conductive patterns in the conductive layer 10. The protective layer 16 can prevent the first surface 102 of the conductive layer 10 from being etched.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for manufacturing a printed circuit board, the method comprising steps of:
   providing an electrically conductive layer;
   laminating a first dielectric layer having a first through opening defined therein on a first surface of the electrically conductive layer;
   forming a protecting layer on the first surface of the electrically conductive layer in the first opening;
   creating an electrically conductive pattern in the conductive layer;
   removing the protecting layer; and
   laminating a second dielectric layer having a second through opening defined therein on an opposite second surface of the electrically conductive layer in a manner that the first through opening is aligned with the second through opening, and thereby a portion of the electrically conductive layer is exposed to the exterior through the first through opening and through the second through opening.

2. The method for manufacturing a printed circuit board as claimed in claim 1, wherein a coating is formed in the first through opening and the coating is cured thereby forming the protective layer.

3. The method for manufacturing a printed circuit board as claimed in claim 2, wherein the coating includes one of the solder resist and liquid photoresist.

4. The method for manufacturing a printed circuit board as claimed in claim 2, wherein the coating is cured in an infrared ray oven.

5. The method for manufacturing a printed circuit board as claimed in claim 4, wherein a temperature of the infrared ray oven is in a range from 90° Centigrade to 110° Centigrade.

6. The method for manufacturing a printed circuit board as claimed in claim 2, wherein the coating is formed using a screen printing method.

7. The method for manufacturing a printed circuit board as claimed in claim 6, wherein a 250-mesh screen template is used in the screen printing method.

8. The method for manufacturing a printed circuit board as claimed in claim 1, wherein the conductive layer is cleaned using an acid solution prior to laminating the first dielectric layer on the conductive layer.

9. The method for manufacturing a printed circuit board as claimed in claim 1, wherein the protective layer is removed using an alkali solution.

10. The method for manufacturing a printed circuit board as claimed in claim 9, wherein the alkali solution is selected from the group consisting of sodium hydroxide solution and sodium carbonate solution.

* * * * *